United States Patent
Grebs

(10) Patent No.: US 8,816,429 B2
(45) Date of Patent: Aug. 26, 2014

(54) CHARGE BALANCE SEMICONDUCTOR DEVICES WITH INCREASED MOBILITY STRUCTURES

(75) Inventor: Thomas E. Grebs, South Jordan, UT (US)

(73) Assignee: Fairchild Semiconductor Corporation, San Jose, CA (US)

( * ) Notice: Subject to any disclaimer, the term of this patent is extended or adjusted under 35 U.S.C. 154(b) by 374 days.

(21) Appl. No.: 13/177,931

(22) Filed: Jul. 7, 2011

(65) Prior Publication Data

US 2013/0009237 A1    Jan. 10, 2013

(51) Int. Cl.
*H01L 29/78* (2006.01)
(52) U.S. Cl.
USPC .............. 257/330; 257/335; 257/349
(58) Field of Classification Search
CPC .. H01L 29/78; H01L 29/7813; H01L 29/7827
USPC .............. 257/330, 335–349, E29.147
See application file for complete search history.

(56) References Cited

U.S. PATENT DOCUMENTS

| | | | |
|---|---|---|---|
| 5,349,207 A | 9/1994 | Malhi | |
| 6,849,527 B1 | 2/2005 | Xiang | |
| 7,018,882 B2 | 3/2006 | Tweet | |
| 7,045,412 B2 | 5/2006 | Sugii | |
| 7,233,018 B2 | 6/2007 | Cho | |
| 7,504,691 B2 | 3/2009 | Park | |
| 7,615,849 B2 | 11/2009 | Nakamura | |
| 7,675,115 B2 | 3/2010 | Tezuka | |
| 7,705,396 B2 | 4/2010 | Adan | |
| 7,755,137 B2 | 7/2010 | Dolny | |
| 7,863,685 B2 | 1/2011 | Hshieh | |
| 7,994,573 B2 * | 8/2011 | Pan | 257/332 |
| 8,004,051 B2 | 8/2011 | Denison | |
| 2006/0091455 A1 | 5/2006 | Adan | |
| 2006/0292805 A1 * | 12/2006 | Kawamura et al. | 438/292 |
| 2008/0023733 A1 | 1/2008 | Lee | |
| 2008/0220571 A1 | 9/2008 | Pattanayak | |
| 2010/0059797 A1 | 3/2010 | Ngai | |
| 2010/0078682 A1 | 4/2010 | Ngai | |
| 2010/0244127 A1 | 9/2010 | Ho | |

* cited by examiner

*Primary Examiner* — Tran Tran
(74) *Attorney, Agent, or Firm* — Kenneth E. Horton; Kirton McConkie

(57) ABSTRACT

Charge balanced semiconductor devices with increased mobility structures and methods for making and using such devices are described. The semiconductor devices contain a substrate heavily doped with a dopant of a first conductivity type, a strained region containing a strain dopant in an upper portion of the substrate, an epitaxial layer being lightly doped with a dopant of a first or second conductivity type on the strained region, a trench formed in the epitaxial layer with the trench containing a MOSFET structure having a drift region overlapping the strained region, a source layer contacting an upper surface of the epitaxial layer and an upper surface of the MOSFET structure, and a drain contacting a bottom portion of the substrate. Since the drift region of the MOSFET structure is formed from the strained region in the substrate, the mobility of the drift region is improved and allows higher current capacity for the trench MOSFET devices. Other embodiments are described.

19 Claims, 5 Drawing Sheets

CHARGE BALANCE SEMICONDUCTOR DEVICES WITH INCREASED MOBILITY STRUCTURES

FIELD

This application relates generally to semiconductor devices and methods for making such devices. More specifically, this application describes charge balance semiconductor devices with increased mobility structures and methods for making and using such devices.

BACKGROUND

Semiconductor devices containing integrated circuits (ICs) or discrete devices are used in a wide variety of electronic apparatus. The IC devices (or chips, or discrete devices) comprise a miniaturized electronic circuit that has been manufactured in the surface of a substrate of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices or discrete devices can be fabricated in a layer-by-layer process that uses a combination of many steps, including growing layers, imaging, deposition, etching, doping and cleaning. Silicon wafers are typically used as the substrate and photolithography is used to mark different areas of the substrate to be doped or to deposit and define polysilicon, insulators, or metal layers.

One type of semiconductor device, a metal oxide silicon field effect transistor (MOSFET) device, can be widely used in numerous electronic apparatus, including automotive electronics, disk drives and power supplies. Generally, these devices function as switches, and they are used to connect a power supply to a load. Some MOSFET devices can be formed in a trench that has been created in an epitaxial layer on a substrate. One feature making the trench configuration attractive is that the current flows vertically through the channel of the MOSFET. This permits a higher cell and/or current channel densities than other MOSFETs where the current flows horizontally through the channel and then vertically through the drain. Greater cell and/or current channel densities generally mean more MOSFETs and/or current channels can be manufactured per unit area of the substrate, thereby increasing the current density of the semiconductor device containing the trench MOSFET.

SUMMARY

This application describes charge balanced semiconductor devices with increased mobility structures and methods for making and using such devices. The semiconductor devices contain a substrate heavily doped with a dopant of a first conductivity type, a strained region containing a strain dopant in an upper portion of the substrate, an epitaxial layer being lightly doped with a dopant of first or second conductivity type on the strained region, a trench formed in the epitaxial layer with the trench containing a MOSFET structure having a drift region overlapping the strained region, a source layer contacting an upper surface of the epitaxial layer and an upper surface of the MOSFET structure, and a drain contacting a bottom portion of the substrate. Since the drift region of the MOSFET structure is formed from the strained region in the substrate and the epitaxial layer, the mobility of the drift region is improved and allows higher current capacity for the trench MOSFET devices.

BRIEF DESCRIPTION OF THE DRAWINGS

The following description can be better understood in light of the Figures, in which.

Figure 1:
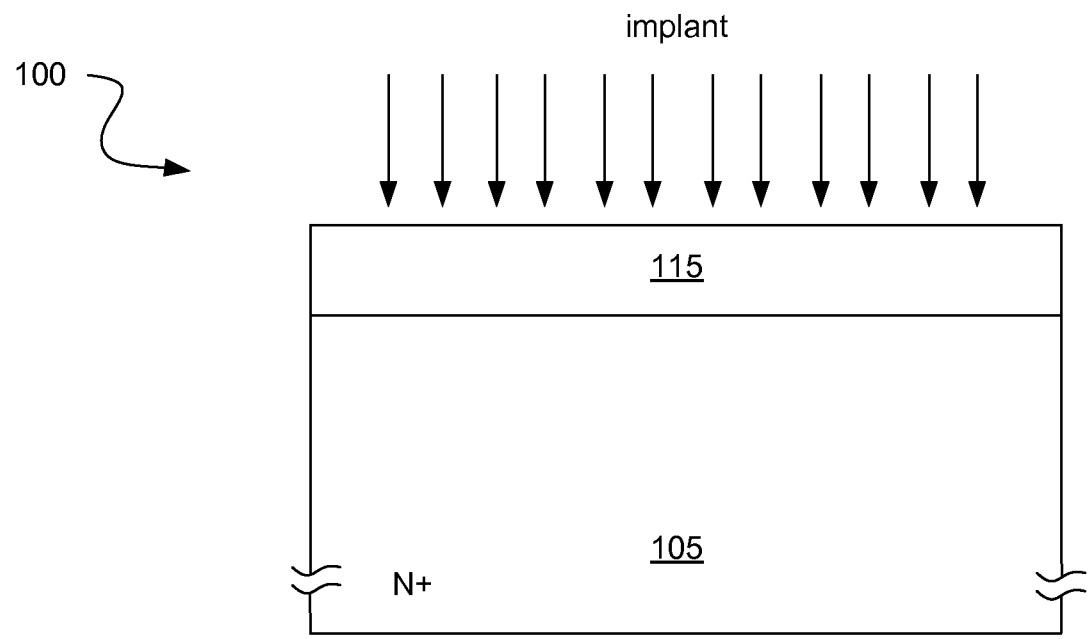
FIG. 1 shows some embodiments of methods for making a semiconductor structure containing a substrate and a strained region.

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. The same reference numerals in different drawings represent the same element, and thus their descriptions will not be repeated. As the terms on, attached to, or coupled to are used herein, one object (e.g., a material, a layer, a substrate, etc.) can be on, attached to, or coupled to another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

DETAILED DESCRIPTION

The following description supplies specific details in order to provide a thorough understanding. Nevertheless, the skilled artisan would understand that the semiconductor devices and associated methods of making and using the devices can be implemented and used without employing these specific details. Indeed, the semiconductor devices and associated methods can be placed into practice by modifying the illustrated devices and methods and can be used in conjunction with any other apparatus and techniques conventionally used in the industry. For example, while description refers to trench MOSFET devices, it could be modified for other semiconductor devices formed in trenches, such as shielded gate semiconductor devices and insulated gate bipolar transistor (IGBT) devices.

Some embodiments of the semiconductor devices and methods for making such devices are shown in FIGS. 1-10. The methods begin in some embodiments, as depicted in FIG. 1, when a semiconductor substrate 105 is first provided. Any substrate known in the art can be used in the semiconductor devices. Suitable substrates include silicon wafers, epitaxial Si layers, bonded wafers such as used in silicon-on-insulator (SOI) technologies, and/or amorphous silicon layers, all of which may be doped or undoped. Also, any other semiconducting material used for electronic devices can be used, including Ge, SiGe, SiC, GaN, GaAs, $In_xGa_yAs_z$, $Al_xGa_yAs_z$, and/or any pure or compound semiconductors, such as III-V or II-VIs and their variants. In some embodiments, the substrate 105 comprises a silicon substrate. In other embodiments, the substrate 105 can be heavily doped with any n-type dopant, as illustrated in FIG. 1.

In the embodiments shown in FIG. 1, a strained region (or layer) 115 can be then be created in an upper surface of the substrate 105. The depth of the strain region 115 will depend on the thickness of future grown epitaxial layer and the thermal budget applied to create the desired device. Thus, in some embodiments, the depth of the strained region 115 can range from about 0.1 to about 10.0 μm. In other embodiments, the depth of the strain region 115 can range from about 0.2 to about 1.0 μm.

The strained region can be created using any process known the art, including the following two methods. In the first method, as shown in FIG. 1, an upper surface of the semiconductor substrate 105 is implanted with a strain dopant to the desired depth needed to create the strained region 115. The strain dopant used to create the strained region 115 can be any type of dopant that will create a lattice strain in the material of the substrate 105. Where the material in the substrate 105 comprises silicon, this strain dopant can be Ge, N, C, or combinations thereof. In some embodiments, the strain dopant comprises Ge atoms.

The concentration of the strain dopant in the strained region 115 can depend on the amount of strained dopant applied to the substrate, overall thermal budget applied, and thickness of epitaxial layer to be grown on top of strained region 115. In some embodiments, the mole fraction of germanium in the strained region 115 can range from about 0.05 to about 0.5. In other embodiments, the mole fraction of germanium of the strain dopant in the strained region 115 can range from about 0.1 to about 0.3.

The implant process is performed at a sufficient energy until the desired depth of the implant is reached. In some embodiments, the implant process is performed at an energy ranging from about 5 to about 200 KeV. In other embodiments, the implant process is performed at an energy ranging from about 60 to about 100 KeV. In some embodiments, an anneal process is not needed to drive-in the implanted dopants, the temperature and time used to grow the epitaxial layer will anneal and diffuse the Ge.

Figure 2:
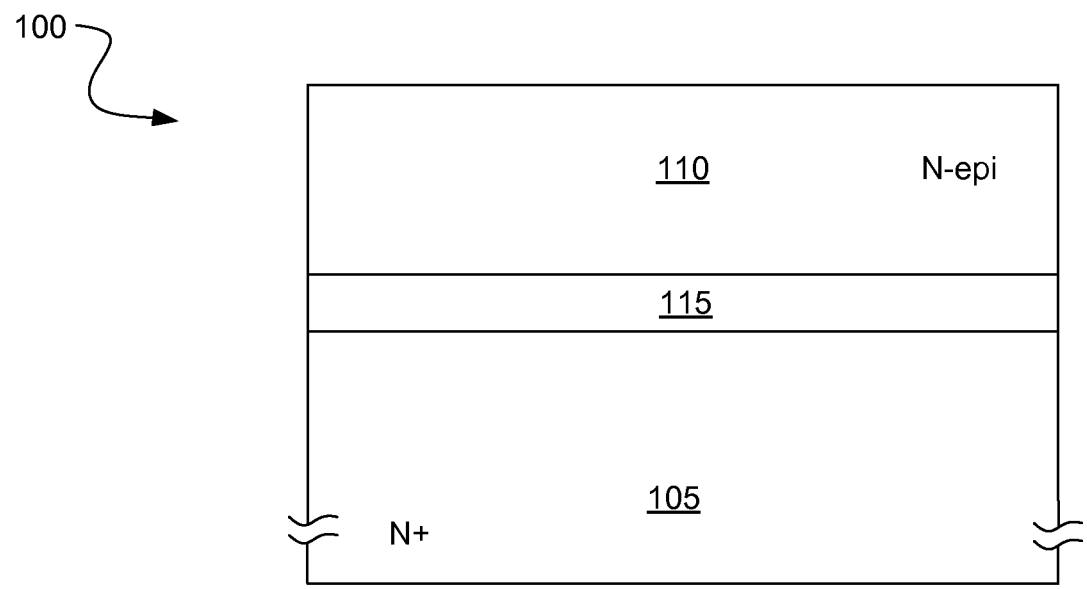
FIG. 2 depicts some embodiments of methods for making a semiconductor structure containing a substrate, strained region, and epitaxial layer.

In some configurations, as shown in FIG. 2, the substrate 105 contains one or more epitaxial ("epi") Si layers (individually or collectively depicted as epitaxial layer 110) located on the strained region 115. The epitaxial layer(s) 110 can be provided using any known process in the art, including any known epitaxial deposition process. The epitaxial layer(s) 110 can be doped using any known process in the art. In some configurations, multiple epitaxial layers can be provided on the strained region 115 and each epitaxial layer can contain a different dopant and/or dopant concentration. In the embodiments illustrated in FIG. 2, though, the epitaxial layer 110 comprises a single epitaxal layer that has been lightly doped with a n-type dopant (which is the same conductivity as the substrate). During the growth of the epitaxial layer 110, some of the strain dopant from the strained region 115 will diffuse into the epitaxial layer 110 and into the substrate layer 105, thereby widening the strained region 115 and providing a higher mobility region and enhancing device performance.

Figure 3:
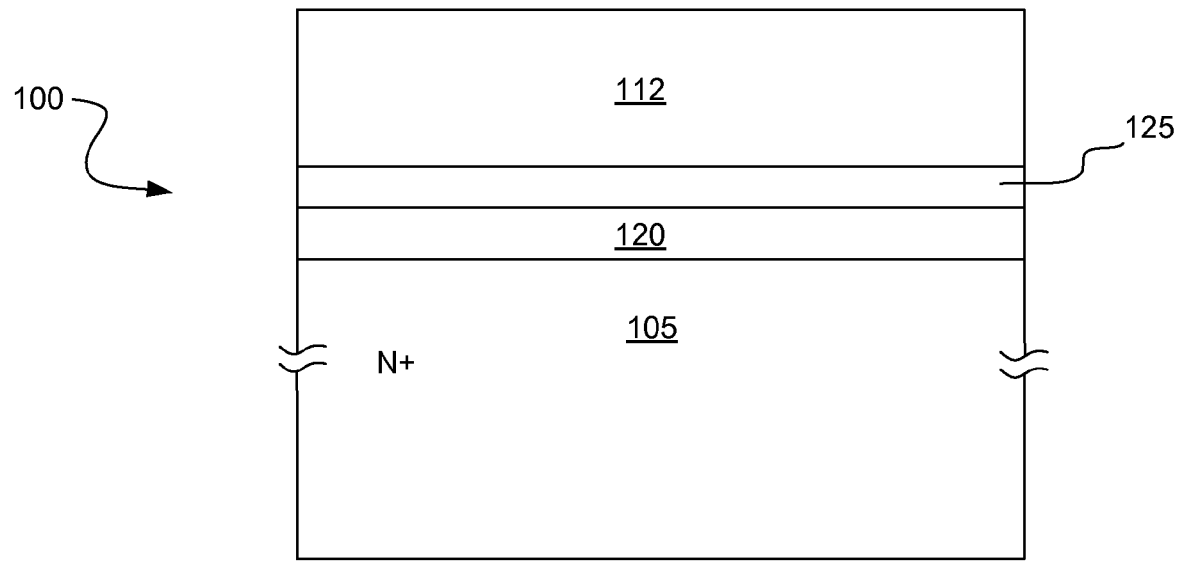
FIG. 3 shows some embodiments of methods for making a semiconductor structure with a substrate, doped epitaxial layer, and an intrinsic layer.
Figure 4:
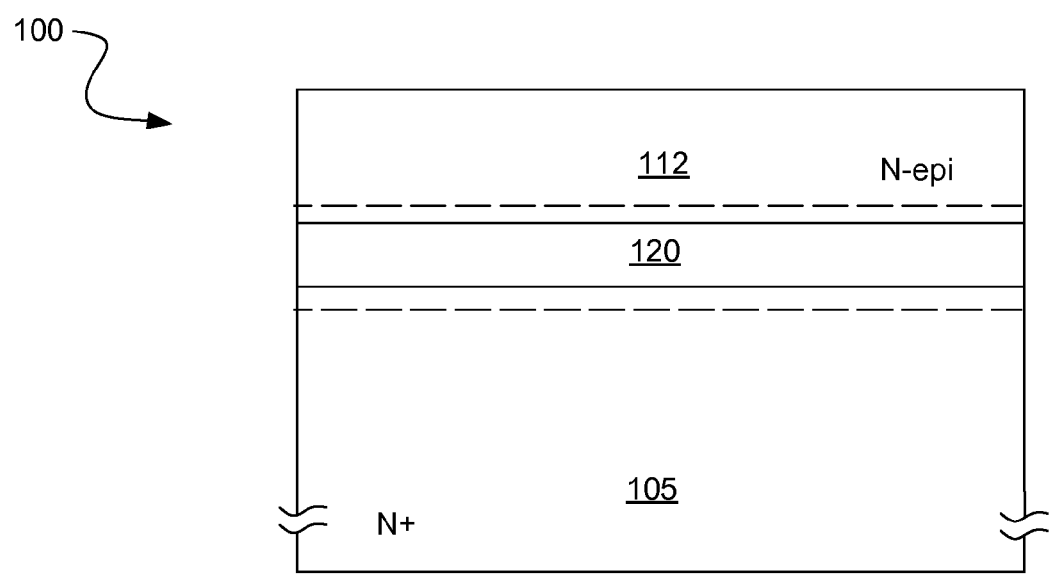
FIG. 4 depicts some embodiments of methods for making a semiconductor structure with a substrate, strained region, and epitaxial layer.

The second method of forming the strained region 115 is illustrated in FIGS. 3-4. In this method, the substrate 105 can be formed as described above. Then, a dopant epitaxial layer 120 can be formed on an upper surface of the substrate 105. The dopant epitaxial layer 120 contains the strain dopant that will be used to create the strained region 115. Where the material in the substrate 105 is silicon, this strain dopant can be Ge, N, C, or combinations thereof. In some embodiments, the strain dopant comprises Ge atoms and so the dopant epitaxial layer 120 comprises a Ge epitaxial layer.

The dopant epitaxial layer 120 should be sufficient thick and/or contain a sufficient concentration of the strain dopant (i.e., Ge) so that it will diffuse from layer 120 into the substrate 105 and an overlying epitaxial layer 112 during subsequent processing. In some embodiments, the thickness of the dopant epitaxial layer 120 can range from about 0.1 to about 10 μm. In other embodiments, the thickness of the dopant epitaxial layer 120 can range from about 0.1 to about 1.0 μm. In some embodiments, the mole fraction of the dopant in the epitaxial layer 120 can range from about 0.05 to about 0.50. In other embodiments, this mole fraction can range from about 0.1 to about 0.3.

Once the dopant epitaxial layer 120 has been deposited, an optional intrinsic layer 125 of undoped silicon can be formed over the dopant epitaxial layer 120. The intrinsic layer 125 operates to limit the amount of up diffusion from the strained growth region and the substrate layer into the epitaxial layer. Thus, the intrinsic layer can minimize the movement of the strained silicon region, thereby providing a higher mobility region at the epitaxial to substrate interface region.

Next, an epitaxial layer 112 can be formed over the dopant epitaxial layer 120 (or the intrinsic layer 125 when present), as shown in FIG. 3. The epitaxial layer 112 can contain one or more epitaxial ("epi") Si layers (individually or collectively depicted as epitaxial layer 110) located on an upper surface thereof. The epitaxial layer 112 can be provided using any known process in the art, including any known epitaxial deposition process. The epitaxial layer(s) can be lightly doped with an n-type dopant. During the growth of the epitaxial layer 112, some of the strain dopant from the doped epitaxial layer 120 will diffuse into the substrate 105 and up into the epitaxial layer 112, as shown in FIG. 4 by the dotted lines. This diffusion widens the strained region and provides a higher mobility region and enhancing device performance. In some embodiments, multiple epitaxial layers can be used, such as n-type epi layer on an n-type substrate followed by p-type epitaxial layer in which the p-type epitaxial layer acts as the well junction of the MOSFET.

Figure 5:
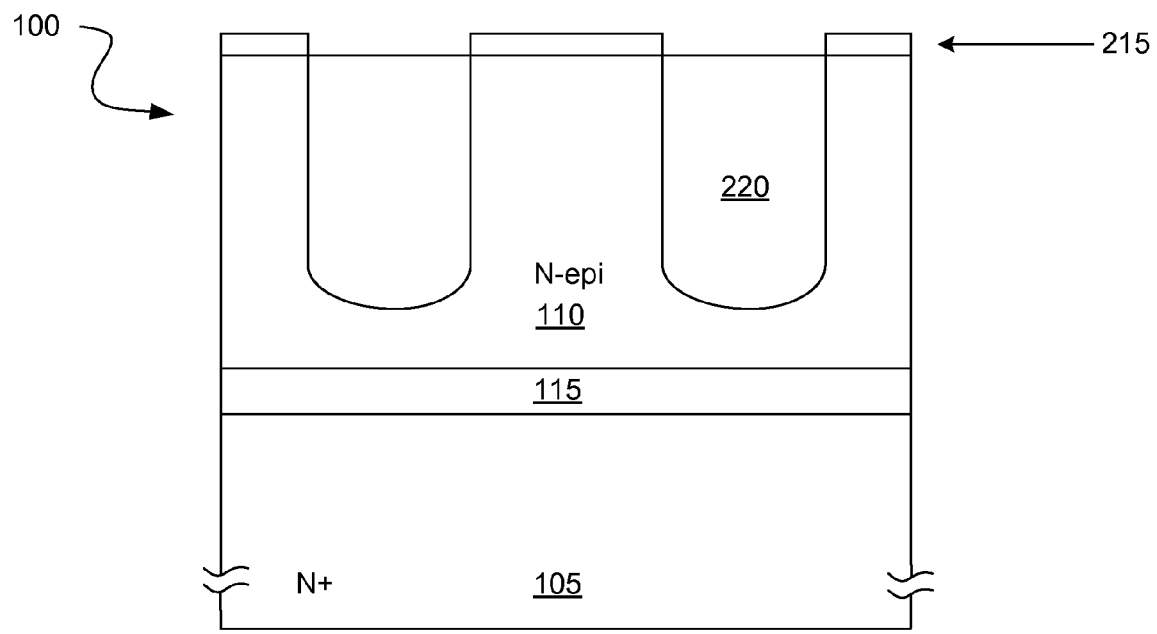
FIG. 5 depicts some embodiments of methods for making a semiconductor structure with trenches.

The methods for making the semiconductor devices continues when a trench structure 220 can be formed in the epitaxial layer 110, as shown in FIG. 5. The bottom of the trench structure 220 can reach anywhere in epitaxial layer 110, stain layer 115, or even substrate 105. The trench structure 220 can be formed by any known process. In some embodiments, a mask 215 can be formed on the upper surface of the epitaxial layer 110. The mask 215 can be formed by first depositing a layer of the desired mask material and then patterning it using a photolithography and etch process so the desired pattern for the mask 215 is formed.

The epitaxial layer 110 can then be etched by any known process until the trench 220 has reached the desired depth and width in the epitaxial layer 110. The depth and width of the trench 220, as well as the aspect ratio of the width to the depth, can be controlled so that so a later deposited insulating layer properly fills in the trench and avoids the formation of voids. In some embodiments, the sidewall of the trench is not perpendicular to the upper surface of the epitaxial layer 110. Instead, the angle of the trench sidewall can range from about 90 degrees (a vertical sidewall) to about 80 degrees relative to the upper surface of the epitaxial layer 110. The trench angle can also be controlled so a later deposited insulating layer or any other material properly fills in the trench and avoids the formation of voids.

Figure 6:
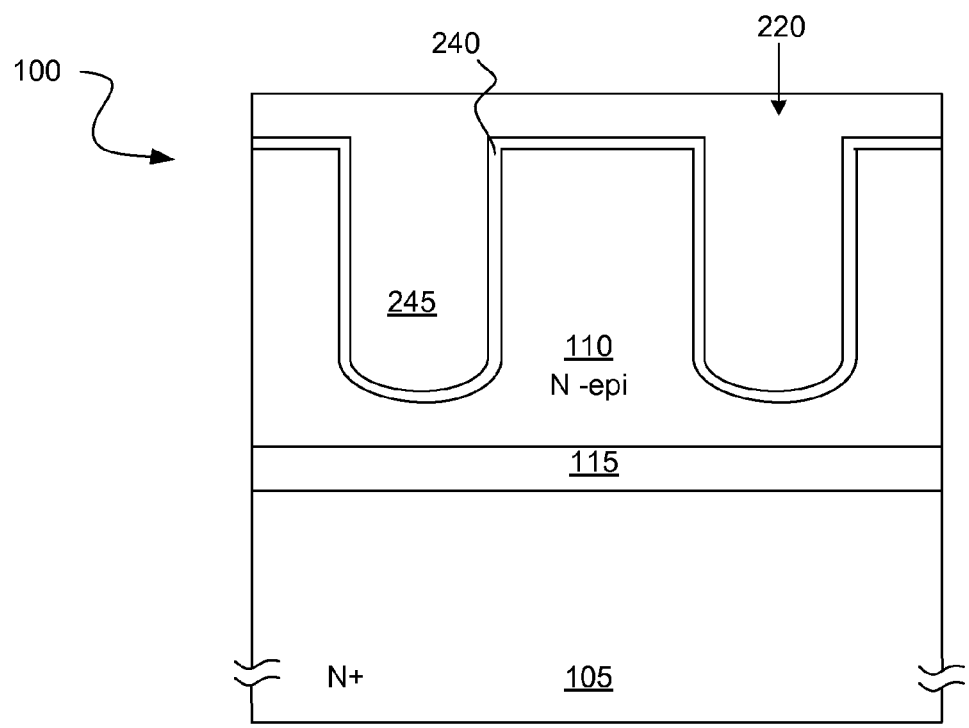
FIG. 6 depicts some embodiments of methods for making a semiconductor structure with an insulating layer and conductive layer formed in the trenches.

Next, as shown in FIG. 6, a high quality oxide (or other insulating material) layer 240 can be formed in the bottom and the sidewall of the trench 220 and the upper surface of the epitaxial layer 110. In these embodiments, the high quality oxide layer can be formed by oxidizing the epitaxial layer 110 in an oxide-containing atmosphere until the desired thickness of the high-quality oxide layer has been grown on the bottom and the sidewall of the trench 220.

Then, a conductive layer 245 can be deposited on the oxide layer 240 in the lower, middle, or upper part of the trench 120. The conductive layer 245 can comprise any conductive and/or semiconductive material known in the art including any metal, silicide, semiconducting material, doped polysilicon, or combinations thereof. The conductive layer can be deposited by any known deposition process, including chemical vapor deposition processes (CVD, PECVD, LPCVD) or sputtering processes using the desired metal as the sputtering target.

Figure 7:
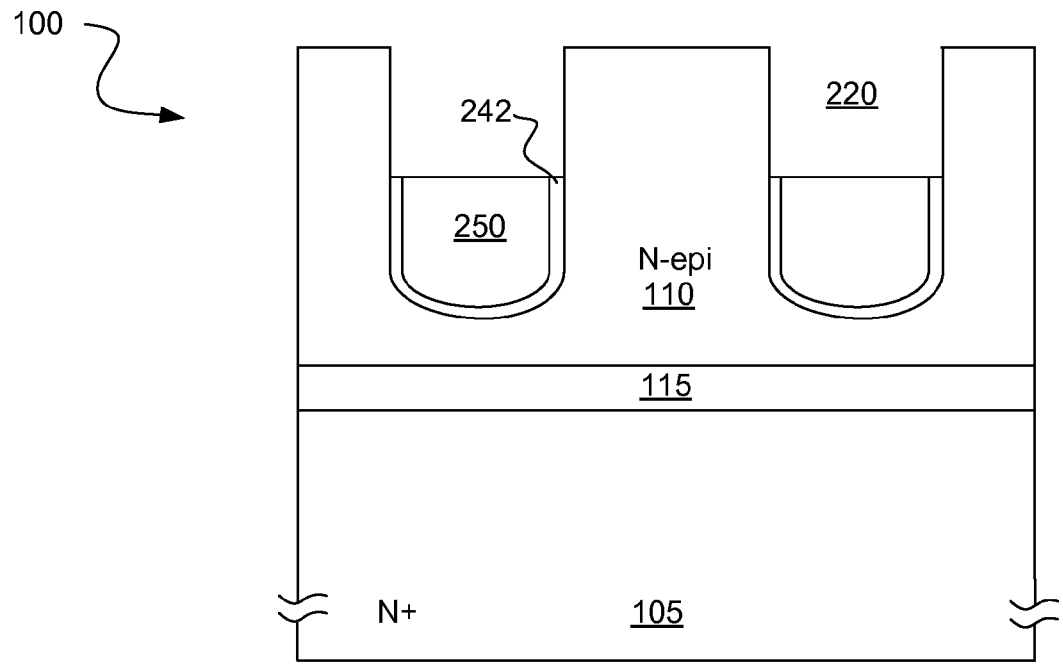
FIG. 7 depicts some embodiments of methods for making a semiconductor structure with a gate insulator and gate conductor in the trench.

The conductive layer can be deposited so that it fills and overflows over the upper part of the trench 220, as shown in FIG. 6. Then, a shielded gate electrode (or shielding gate) 250 can be formed from the conductive layer 245 using any process known in the art. In some embodiments, as shown in FIG. 7, the shielded gate 250 can be formed by removing the upper portion of the conductive layer 245 using any process known the art, including any etchback process. The result of the removal process also removes the oxide layer 240 on the upper portion of trench sidewall (and on top of the epitaxial layer 110) and forms a shield oxide layer 242, leaving a conductive layer (the shield gate 250) overlying the shield oxide layer 242 formed on the bottom of the trench 220 and sandwiched between the shield oxide layer left on the lower potions of the trench sidewalls, as shown in FIG. 7. As known in the art, a shielded gate electrode can be coupled to the later formed source or gate regions to provide differing device objectives.

Figure 8:
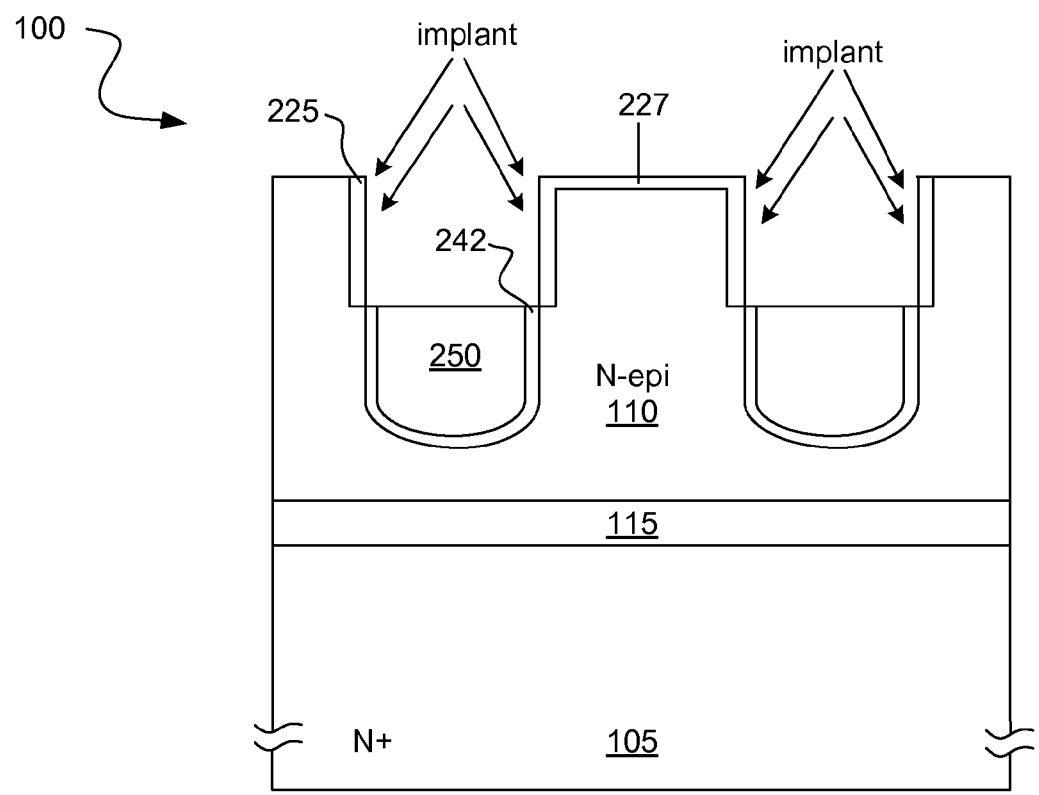
FIG. 8 depicts some embodiments of methods for making a semiconductor structure with a second strained region formed in the sidewalls of the trench.

In some embodiments, the sidewall of the trench structure 220 that remains exposed can then be doped with a strain dopant so that a sidewall dopant region 225 (and in some areas, dopant region 227 in an upper surface of the epitaxial layer 110) is formed in the epitaxial layer 110 near the sidewall of the trench 220, as shown in FIG. 8. Where the material in epitaxial layer 110 is silicon, this strain dopant can be Ge, N, C, or combinations thereof. The strain dopant used to create the sidewall dopant region 225 can be the same or different than that used to create strained region 115. In some embodiments, the strain dopant comprises Ge atoms.

The sidewall doping process can be performed using any doping process which implants the desired dopants to the desired width. In some embodiments, this sidewall doping process can be performed using any angled implant process, a gas phase doping process, a diffusion process, depositing and growing a selective epitaxial layer containing germanium and then driving the dopants into the side wall, or a combination of these process. In other embodiments, an angled implantation process can be used with an angle ranging from about 0 degrees (a vertical implant process) to about 88 degrees. The implant angle depends on several factors, such as recess depth of shielded gate 250 and device pitch (the distance from leading edge of one trench to the leading edge of an adjacent trench). In other embodiments, a typical implant angle range from 40 to 60 degrees.

By using the angled implant process, the dopant concentrations in the epitaxial layers 110 adjacent the sidewall form a second strained region in the sidewall dopant region 225, as shown in FIG. 8. This second strained region will be located in the channel region of the vertical MOSFET structures subsequently formed in trench 220 and would be activated during subsequent processing steps used to complete the trench MOSFET structures.

Figure 9:
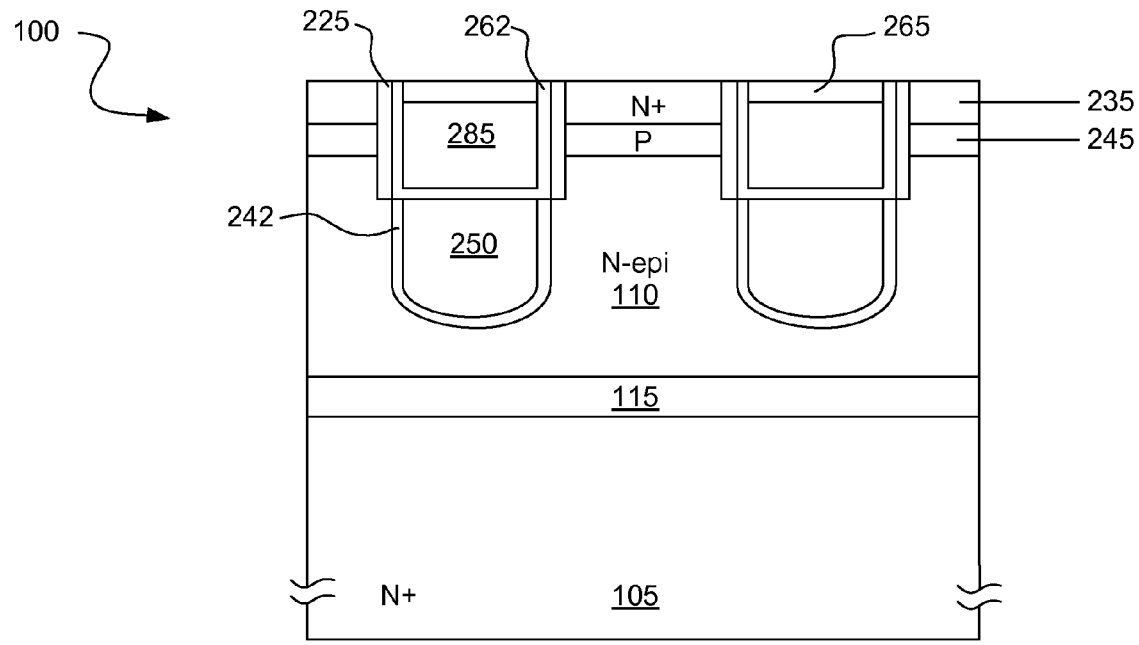
FIG. 9 shows some embodiments of methods for making a semiconductor structure with a dopant region and contact region formed in the epitaxial layer.

The MOSFET structure in the trench 220 can then be completed as known in the art. In some embodiments, a p-region 245 can be formed in an upper portion of the epitaxial layer 110, as shown in FIG. 9. The p-region can be formed using any process known in the art. In some embodiments, the p-regions regions 245 can be formed by implanting a p-type dopant in the upper surface of the epitaxial layer 110 and then driving-in the dopant using any known process. In some embodiments, the p-region 245 can be formed by angled implantation similar to that used to form the sidewall dopant region 225, but at higher energy levels.

Next, a gate oxide layer 262 can be formed as known in the art. This gate oxide layer 262 also functions as an IPD, inter-poly dielectric layer, since it is located between the shielded gate electrode 250 and the later formed gate 285. Then a gate poly region (or gate) 285 can be deposited and etched using any known process in the art. Then, a contact region 235 can be formed on the exposed upper surface of the epitaxial layer 110. The contact region 235 can be formed using any process known in the art. In some embodiments, the contact regions 235 can be formed by implanting an n-type dopant in the upper surface of the epitaxial layer 110 and then driving-in the dopant using any known process. The resulting structures after forming the contact region 235 are illustrated in FIG. 9.

Then, the upper surface of the gate 285 is covered with an overlying insulating layer. The overlying insulating layer can be any insulating material known in the art. In some embodiments, the overlying insulating layer comprises any dielectric material containing B and/or P, including BPSG, PSG, or BSG materials. In some embodiments, the overlying insulating layer may be deposited using any CVD process until the desired thickness is obtained. Examples of the CVD processes include PECVD, APCVD, SACVD, LPCVD, HDPCVD, or combinations thereof. When BPSG, PSG, or BSG materials are used in the overlying insulating layer, they can be reflowed.

Then a portion of the overlying insulating layer is removed to leave an insulation cap 265. In the embodiments depicted in FIG. 9, the overlying insulating layer can be removed using any known mask and etching procedure that removes the materials in locations to expose independent portions of gate 285 and contact region 235. Thus, an insulating cap 265 is formed over the gate 285. The excess amounts of the overlying insulating layer can be removed using any etch back or planarization process.

Figure 10:
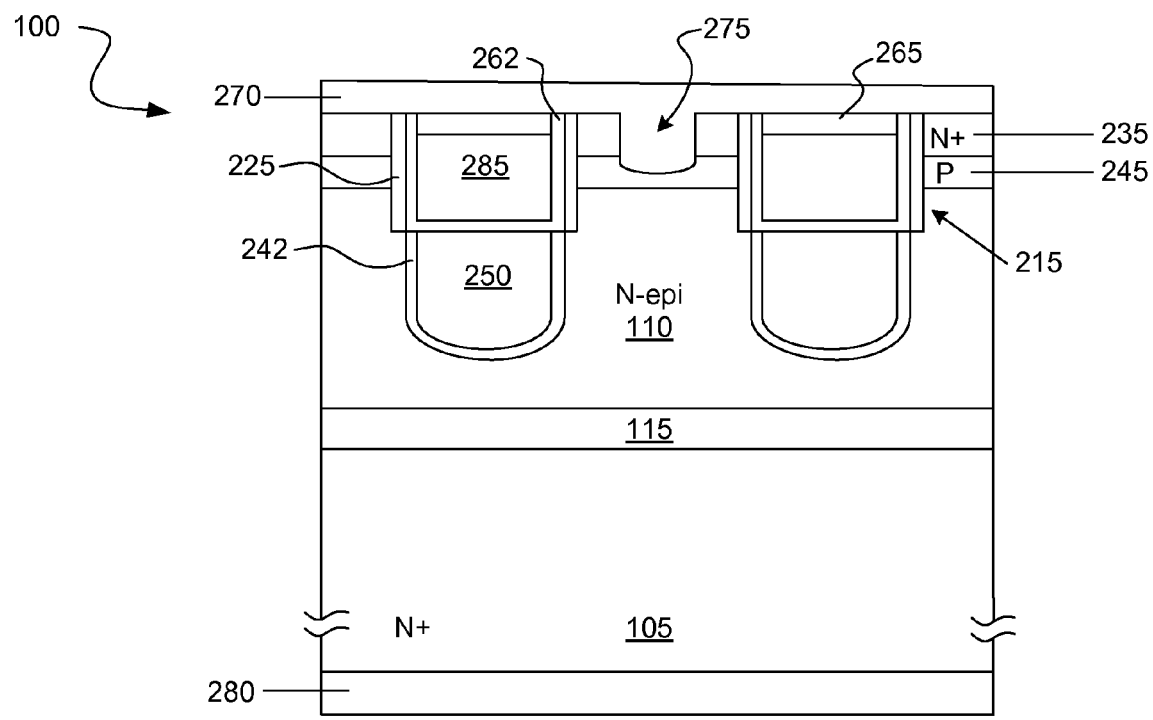
FIG. 10 shows some embodiments of methods for making a semiconductor structure with a source layer and drain.

Next, as depicted in FIG. 10, the contact region (n-region) 235 and the p-region 245 can be etched to form an insert region 275. The insert region 275 can be formed using any known masking and etching process until the desired depth (into the p-region 245) is reached. Next, as shown in FIG. 10, a source layer (or region) 270 can be deposited over the upper portions of the insulation cap 285 and the contact region 235. The source layer 270 can comprise any conductive and/or semiconductive material known in the art, including any metal, silicide, polysilicon, or combinations thereof. The source layer 270 can be deposited by any known deposition process, including chemical vapor deposition processes (CVD, PECVD, LPCVD) or sputtering processes using the desired metal as the sputtering target. The source layer 270 will also fill in the insert region 275.

After (or before) the source layer 270 has been formed, a drain 280 can be formed on the backside of the substrate 105 using any process known in the art. In some embodiments, the drain 280 can be formed on the backside by thinning the backside of the substrate 105 using any process known in the art, including a grinding, polishing, or etch processes. Then, a conductive layer can be deposited on the backside of the substrate 105 as known in the art until the desired thickness of the conductive layer of the drain is formed, as shown in FIG. 10. Alternatively, in some embodiments, the drain region 280 can be brought to the silicon surface through known processes in the art, i.e. TSV (through silicon vias), to have all conductors on the same side of the device.

The semiconductor structures 100 formed during these processes contain a first strained region 115 and/or a second strained region 215 that can enhance the carrier mobility of silicon, thereby reducing resistance and power consumption and increasing drive current, frequency response, operating speed, and current capacity. The silicon material in these regions has a tensile strain imparted to the lattice of the silicon by incorporating Ge (or N or C) atoms therein. The silicon-germanium lattice is generally wider spaced than a silicon lattice because of the larger germanium atoms. In other words, the Si atoms of the silicon lattice are spread apart by the larger germanium atoms, thereby creating a tensile strain in the silicon layer. The amount of tensile strain can be customized by the amount of the Ge atoms incorporated into Si lattice.

In some embodiments, the semiconductor structures 100 contain a first strained region 115. The dopant(s) in first strained region 115 can improve the mobility of the drift region of the trench MOSFET devices. The first strained region 115 can be created prior to growing an epitaxial layer, which is especially useful for semiconductor devices having a minimum thermal budget. As well, the first strained region 115 can be created with or without a masking layer to direct the dopant to a specific region, similar to BiCMOS devices having a buried doped region.

In other embodiments, the semiconductor structures 100 contain a second strained region. The second strained region can be created using an angled implant method that allows alignment of the strain region for selected channel regions in the trench MOSFET devices. Combining the angle well implant with angle mobility implants can be used set the channel length with the highest mobility for shielded structures. As well, angled implants can be used to create split gate shielded structures for trench MOSFET devices.

It is understood that all material types provided herein are for illustrative purposes only. Accordingly, the dielectric layers in the embodiments described herein may comprise low-k or high-k dielectric materials. As well, while specific dopants are names for the n-type and p-type dopants, any other known n-type and p-type dopants (or combination of such dopants) can be used in the semiconductor devices. As well, although the devices of the invention are described with reference to a particular type of conductivity (P or N), the devices can be configured with a combination of the same type of dopant or can be configured with the opposite type of conductivity (N or P, respectively) by appropriate modifications.

In some embodiments, a method for making a semiconductor device comprises providing a semiconductor substrate heavily doped with a dopant of a first conductivity type, providing a strained region in an upper portion of the substrate, the strained region containing a strain dopant, providing an epitaxial layer on the strained region, the epitaxial layer being lightly doped with a dopant of a first or second conductivity type, providing a trench in the epitaxial layer, the trench containing a MOSFET structure a drift region overlapping the strained region, providing a source layer contacting an upper surface of the epitaxial layer and an upper surface of the MOSFET structure, and providing a drain contacting a bottom portion of the substrate.

In some embodiments, a method for making a semiconductor device comprises providing a semiconductor substrate heavily doped with a dopant of a first conductivity type, implanting a strain dopant into an upper portion of the substrate to create a strained region, depositing an epitaxial layer on the strained region, the epitaxial layer being lightly doped with a dopant of a first or second conductivity type, forming a trench in the epitaxial layer, forming a MOSFET structure in the trench, the MOSFET structure containing a drift region overlapping the strained region, forming a source layer on an upper surface of the epitaxial layer and an upper surface of the MOSFET structure, and forming a drain on a bottom portion of the substrate.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor device, comprising:
    a semiconductor substrate heavily doped with a dopant of a first conductivity type;
    a strained region in an upper portion of the substrate, the strained region containing a strain dopant comprising germanium, wherein the mole fraction of germanium in the strained region ranges from about 0.05 to about 0.5;
    an epitaxial layer on the strained region, the epitaxial layer being lightly doped with a dopant of a first or second conductivity type;
    a trench formed in the epitaxial layer, the trench containing a MOSFET structure with a drift region overlapping the strained region;
    a source layer contacting an upper surface of the epitaxial layer and an upper surface of the MOSFET structure; and
    a drain contacting a bottom portion of the substrate.

2. The device of claim 1, wherein the first conductivity type dopant is an n-type dopant and the second conductivity type dopant is a p-type dopant.

3. The device of claim 1, wherein the strain dopant further comprises N, C, or combinations thereof.

4. The device of claim 1, wherein the depth of the strained region ranges from about 0.1 to about 10 µm.

5. The device of claim 1, wherein the depth of the strained region ranges from about 0.2 to about 1 µm.

6. The device of claim 1, wherein the mole fraction of germanium in the strained region can range from about 0.1 to about 0.3.

7. The device of claim 1, further comprising another strained region in the sidewall of the trench.

8. A trench MOSFET device, comprising:
   a semiconductor substrate heavily doped with a dopant of a first conductivity type;
   a strained region in an upper portion of the substrate, the strained region containing a strain dopant comprising germanium, wherein the mole fraction of germanium in the strained region ranges from about 0.05 to about 0.5;
   an epitaxial layer on the strained region, the epitaxial layer being lightly doped with a dopant of a first or second conductivity type;
   a trench formed in the epitaxial layer, the trench containing a MOSFET structure with a drift region overlapping the strained region;
   a source layer contacting an upper surface of the epitaxial layer and an upper surface of the MOSFET structure; and
   a drain contacting a bottom portion of the substrate.

9. The device of claim 8, wherein the first conductivity type dopant is an n-type dopant and the second conductivity type dopant is a p-type dopant.

10. The device of claim 8, wherein the strain dopant further comprises N, C, or combinations thereof.

11. The device of claim 8, wherein the depth of the strained region ranges from about 0.1 to about 10 µm.

12. The device of claim 8, further comprising another strained region in the sidewall of the trench.

13. A trench MOSFET device, comprising:
   a Si substrate heavily doped with a dopant of a first conductivity type;
   a strained region in an upper portion of the substrate, the strained region containing a strain dopant comprising Ge wherein the mole fraction of germanium in the strained region ranges from about 0.05 to about 0.5;
   a Si epitaxial layer on the strained region, the epitaxial layer being lightly doped with a dopant of a first or second conductivity type;
   a trench formed in the epitaxial layer, the trench containing a MOSFET structure with a drift region overlapping the strained region;
   a source layer contacting an upper surface of the epitaxial layer and an upper surface of the MOSFET structure; and
   a drain contacting a bottom portion of the substrate.

14. The device of claim 13, wherein the depth of the strained region ranges from about 0.1 to about 10 µm.

15. The device of claim 8, wherein the mole fraction of germanium in the strained region can range from about 0.1 to about 0.3.

16. The device of claim 8, wherein the depth of the strained region ranges from about 0.2 to about 1 µm.

17. The device of claim 13, wherein the mole fraction of germanium in the strained region can range from about 0.1 to about 0.3.

18. The device of claim 13, wherein the depth of the strained region ranges from about 0.2 to about 1 µm.

19. The device of claim 13, wherein the strain dopant further comprises N, C, or combinations thereof.

* * * * *